United States Patent [19]

Gutierrez

[11] Patent Number: 5,069,749
[45] Date of Patent: Dec. 3, 1991

[54] METHOD OF FABRICATING INTERCONNECT LAYERS ON AN INTEGRATED CIRCUIT CHIP USING SEED-GROWN CONDUCTORS

[75] Inventor: Jean-Marie Gutierrez, Shrewsbury, Mass.

[73] Assignee: Digital Equipment Corporation, Maynard, Mass.

[21] Appl. No.: 239,036

[22] Filed: Aug. 29, 1988

Related U.S. Application Data

[63] Continuation of Ser. No. 891,972, Jul. 29, 1986, abandoned.

[51] Int. Cl.$^5$ ............................................... H01L 21/00
[52] U.S. Cl. ..................................... 156/646; 156/649; 156/653; 156/657; 156/662; 156/656; 427/99; 427/124; 437/192
[58] Field of Search .................. 437/192, 193; 156/656

[56] References Cited

U.S. PATENT DOCUMENTS

| 4,184,909 | 1/1980 | Chang et al. | 156/646 |
| 4,343,676 | 8/1982 | Tarng | 156/628 |
| 4,349,408 | 9/1982 | Tarng et al. | 156/128 |
| 4,518,629 | 5/1985 | Jeuch | 427/90 |
| 4,520,554 | 6/1985 | Fisher | 427/90 |
| 4,536,249 | 8/1985 | Rhodes | 156/646 |
| 4,560,436 | 12/1985 | Bukhman et al. | 156/653 |
| 4,617,087 | 10/1986 | Iyer et al. | 427/91 |

OTHER PUBLICATIONS

Japanese Journal of Applied Physics, Supplements, Extended Abstracts of the 15th Conference on Solid State Devices and Materials, Tokyo, Aug. 30th-Sep. 1, 1983, pp. 225-228, JP; T. Moriga et al.: "A New Encroachment-Free Tungsten CVD Process with Superior Selectivity"*p. 225, paragraph 4-p. 226, paragraph 4*.

Solid State Technology, vol. 28, No. 12, Dec. 1985, pp. 51-59, Port Washington, N.Y., U.S.; E. K. Broadbent et al.: "Selective Tungsten Processing by Low Pressure CVD" *FIGS. 1,7; p. 52, paragraph 4-p. 55, paragraph 3*.

International Electron Devices Meeting, Technical Digest, Dec. 7-9, 1981, pp. 54-57, Washington, D.C., U.S.; P. A. Gargini et al.: "WAS: Low Resistance Self-Aligned Source, Drain and Gate Transistors" *p. 55, paragraph 2-p. 57, paragraph 1; FIG. 1*.

Journal of Vacuum Science and Technology A, vol. 3, No. 6, Nov.-Dec. 1985, pp. 2298-2302, New York, U.S.; J.-O. Carlsson et al.: "Selective Deposition of Tungsten-Prediction of Selectivity" *p. 2298, paragraphs 4-6; p. 2301, paragraph 5-p. 2302, paragraph 1*.

Primary Examiner—David A. Simmons
Assistant Examiner—Thi Dang
Attorney, Agent, or Firm—Cesari and McKenna

[57] ABSTRACT

A process of forming an interconnection layer for an integrated circuit in which the conductor pattern is embedded in a layer of insulating material to form a conductor-insulator layer. The conductor-insulator layer is formed by selectively filling recesses in a layer of insulating material with conductive material. The filling of the recesses is accomplished in two steps: depositing an initial layer of conductive material by a process which selectively deposits the conductive material on a seed material located in the bottom of the recesses, then depositing the bulk of the conductive material by a process which selectively deposits conductive material on existing conductive material.

24 Claims, 2 Drawing Sheets

METHOD OF FABRICATING INTERCONNECT LAYERS ON AN INTEGRATED CIRCUIT CHIP USING SEED-GROWN CONDUCTORS

This is a continuation of U.S. application Ser. No. 891,972 filed July 29, 1986, now abandoned.

FIELD OF THE INVENTION

The invention relates to methods of fabricating semiconductor integrated circuit chips, and more particularly to methods of forming interconnection layers on integrated circuit chips where the upper surface of each layer is relatively planar.

BACKGROUND OF THE INVENTION

Providing several interconnection levels is highly desirable in very large scale integrated circuit (VLSI) technology, as it allows both higher packing density of the active components and greater freedom in their placement on the chip. An interconnection layer typically includes an insulating layer on which a conductive interconnection pattern is formed or in which it is embedded. An interconnection layer is typically formed of two conductor-insulator layers, including an upper layer providing horizontal paths among areas of the chip and a lower conductor-insulator layer providing vertical connections between the conductors in the upper layer and the interconnection layer or the semiconductor therebeneath. The connection in the lower conductor-insulator layers of each interconnetion layer ar called solid vias which ar through the insulating layer and filled with conductive material provide connections to the underlying interconnection layers or semiconductor devices.

Care must be taken in fabricating the chip to ensure that each interconnection layer is provided with a relatively planar upper surface before the next interconnection layer is applied. Unless this is done, sharp corners and discontinuities, known as steps, can develop in the surface of an interconnection layer. If metal is being used as the conductive material, which is preferred to polysilicon because of its lower resistivity, problems can develop in the interconnections because metals typically have poor coverage over corners and steps. Accordingly, as each interconnection layer is applied, it is desirable to ensure that the top surface of each interconnection layer has a relatively planar upper surface before beginning the next layer.

One approach to achieving a planar upper surface has been the use of a reflowed glass technique. In this technique an interconect layer is covered by a glass, which is then heated close to its melting point so that it "reflows", leaving a planar upper surface. The glass, usually silicon dioxide, has a quite high melting point. The melting point of the silicon dioxide can be reduced by the introduction of phosphorus into the silicon dioxide, which reduces the glass's melting point to about 1000 degrees Celsius. The melting point of the glass can be reduced by about another 100 degrees by the addition of boron to the glass. The drawbacks of the reflowed glass technique stem from the high temperatures required to melt the glass, which temperatures may be higher than the melting points of the metals used as conductors. For example, the reflowed glass technique cannot be used to smooth a surface above an interconnection layer in which aluminum is the conductor, because of aluminumn's relatively low melting point. There is also a risk of metal corrosion with the formation of phosphoric acid over time. In addition, boron can diffuse out of the silicon dioxide and into the underlying silicon, which can result in instability in the threshold voltage of MOS transistors.

Refractory metals can be used in place of aluminum as the interconnect material in the reflowed glass process. The high melting points of refractory metals ensure that they will not melt during the reflow process. A problem with using such metals, however, is that at temperatures over about 700 degrees Celsius, metal silicide may form where the metal comes in contact with the silicon substrate to form connections, which can increase the resistance of the connection.

Another approach to achieving a planar interconnection layer is the use of lift-off techniques. A layer of resist is used as a mask in the etching of recesses in the surface of the chip. A layer of metal is then formed having thickness comparable to the depth of the recesses, thereby filling the recesses with metal. The metal outside of the recesses is removed by dissolving underlying the layer of resist, which causes the metal on top of the resist to lift off, leaving the metal in the recesses.

A disadvantage of the use of lift-off is the requirement that metal be deposited at low temperatures (about 150 degress Celsius) in order to avoid decomposition of the layer of resist on which the metal is deposited. Metal deposited at such low temperatures is subject to recrystallization and hillock formation during further processing steps of the integrated circuit chip.

SUMMARY OF THE INVENTION

The present invention aims to provide a method of forming conductor-insulator layers which are suitable for the formation of multiple interconnection layers without the need for processing at the high temperature required to flow glass or the need to deposit metal at the low temperature required by lift-off.

A conductor-insulator layer for providing electrical interconnection among devices in an integrated circuit is created by forming a pattern of conductive material in an insulating layer, such that the top surface of the conductive material is substantially even with the top surface of the insulating material. The pattern of conductive material is formed by a process that selectively deposits conductive material in regions where a seed material is present.

In performing the inventive process, a layer of seed material is deposited on the surface of an integrated circuit chip and etched in the pattern desired for the conductive material. A layer of insulating material, typically silicon dioxide, is then deposited. Recesses, in the form of holes or trenches, are formed in the insulating layer, exposing the patterned seed material. The chip is subjected to a reactive agent which selectively deposits conductive material where the seed material is exposed After an initial layer of conductive material has been deposited, the reactive agent is changed to on which selectively deposits conductive material only on top of conductive material. The deposition process is continued until the recesses are filled with conductive material.

In one embodiment the conductive material is tungsten and the seed material is silicon. Initially, tungsten is deposited selectively on the silicon by reducing the tungsten fluoride with silicon. After deposition of tungsten has been initiated, the tungsten layer is extended in thickness by reducing tungsten fluoride with hydrogen.

BRIEF DESCRIPTION OF THE DRAWING

The invention is pointed out with particularity in the appended claims. The above and other advantages of the invention may be better understood by referring to the following detailed description in conjunction with the drawing in which:

DESCRIPTION OF AN ILLUSTRATIVE EMBODIMENT

Figure 1:
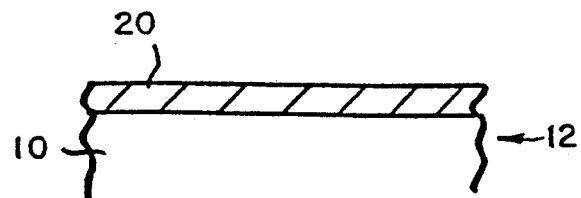
FIGS. 1-6 schematically depict a cross-sectional view of a portion of an integrated circuit chip in successive stages in forming a conductor-insulator layer according to the instant invention.
Figure 2:
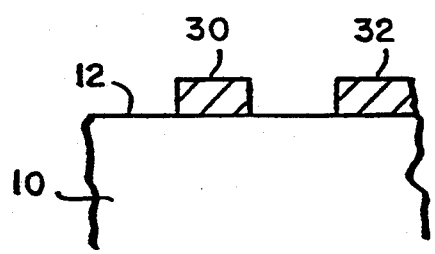

With reference to FIG. 1, an integrated circuit chip 10 has an upper surface 12. Seed material, such as polysilicon, is formed and patterned as illustrated in FIGS. 1 and 2. As shown in FIG. 1 a layer 20 of seed material is deposited over the entire surface 12. The seed layer 20 is then patterned by conventional photolithographic techniques, for example, to leave portions 30 and 32. The pattern of the seed material remaining, that is, the pattern defined by portions 30 and 32, corresponds to the desired pattern of conductive material to be deposited in the conductor-insulator layer.

Figure 3:
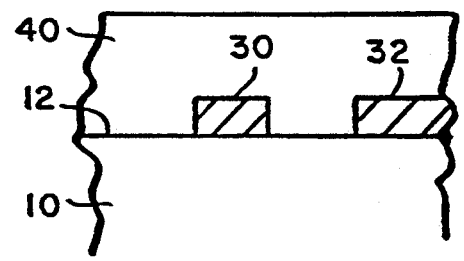
Figure 4:
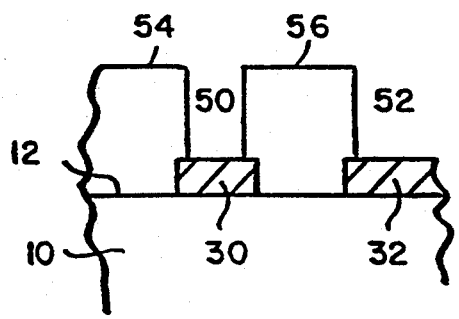

As shown in FIG. 3, a layer of insulating material 40, in this case silicon dioxide, is formed over the seed material portions 30 and 32 and the exposed portions of the surface 12. The thickness of the insulating layer 40 corresponds to the thickness of the conductor-insulator layer being formed. The insulating layer 40 is also patterned, leaving portions of insulating material, represented by portions 54 and 56 as shown in FIG. 4. The patterning leaves recesses 50 and 52 in the insulating layer to expose the seed material portions 30 and 32.

In patterning the silicon dioxide layer, it may be preferable to use a mask which leaves recesses 50 and 52 in the silicon dioxide layer which are slightly narrower than the portions of seed material which are to be exposed. Thus, if there is any misalignment of the masks, the resulting recesses 50 and 52 will not expose the underlying chip 10.

At this point the insulating portion of the conductor-insulator layer has been formed, comprising portions 54 and 56 (FIG. 4). In the next steps, the conductive portion of the conductor-insulator layer is deposited in recesses 50 and 52. The conductive material in one embodiment is selected to be tungsten.

The first step in selectively filling the recesses 50 and 52 with conductive material is to deposit an initial layer of conductive material by a process which deposits conductive material selectively where seed material is exposed. In one embodiment, in which tungsten is to be the conductive material, the chip is immersed in an atmosphere of tungsten fluoride gas. The gas reacts with the silicon seed material according to the following formula:

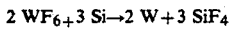

$$2\ WF_6 + 3\ Si \rightarrow 2\ W + 3\ SiF_4$$

The solid tungsten is deposited and the silicon fluoride gas is dispersed. The silicon dioxide insulation portions 54 and 56 do not react with the tungsten fluoride gas, and so no tungsten is deposited thereon.

The reaction of tungsten fluoride with silicon will slow and eventually stop after the deposited conductive material (tungsten) is thick enough to prevent contact between the tungsten fluoride and the silicon. The volume of silicon consumed by this reaction is greater than the volume of tungsten deposited. For these two reasons, this reaction probably will not deposit, by itself, sufficient tungsten to fill the recesses 50 and 52.

Figure 5:
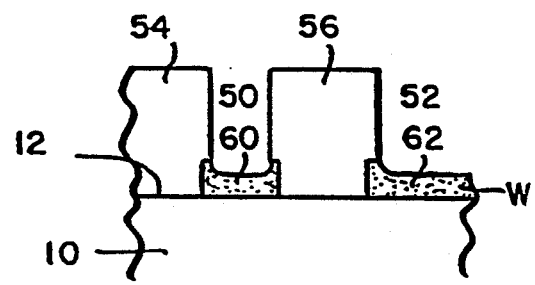

The result of selective deposition of conductive material on the seed material is illustrated in FIG. 5. In the bottom of each of the recesses 50 and 52 is a layer of tungsten 60 and 62, respectively. The reaction of the tungsten fluoride gas with the exposed silicon seed material consumes all or at least some of the seed material 30 and 32. In FIG. 5, the reaction has consumed all of the seed material.

The next step in the process fills the remaining portions of the recesses 50 and 52 with conductive material. In this embodiment, this is accomplished by introducing hydrogen gas into the atmosphere of tungsten fluoride gas. The hydrogen and tungsten fluoride react according to the following formula:

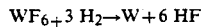

$$WF_6 + 3\ H_2 \rightarrow W + 6\ HF$$

This reaction occurs in the presence of solid tungsten as a catalyst; thus the reaction results in the selective deposition of tungsten in locations where tungsten was previously deposited by the selective deposition on the seed material.

Unlike the selective deposition on the seed material, this second deposition process does not slow as the thickness of the deposited tungsten increases; the tungsten continues to deposit selectively on the already deposited tungsten at a substantially constant rate. When the reaction has progressed until the recesses 50 and 52 are filled with conductive material 70 and 72 (FIG. 6), the chip 10 may be removed from the tungsten fluoride and hydrogen atmosphere to stop the reaction.

Figure 6:
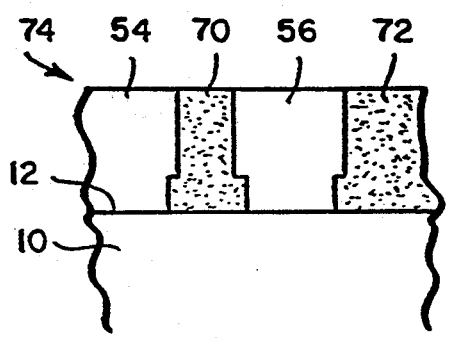

FIG. 6 shows the resulting conductor-insulator layer comprising patterned insulating material 54 and 56 and conductive material 70 and 72. The top surface 74 of the conductor-insulator layer is relatively planar and free of discontinuities. Another conductor-insulator layer can be formed on top of this layer by repeating the above-described steps, as will be shown in connection with FIG. 8.

Figure 7:
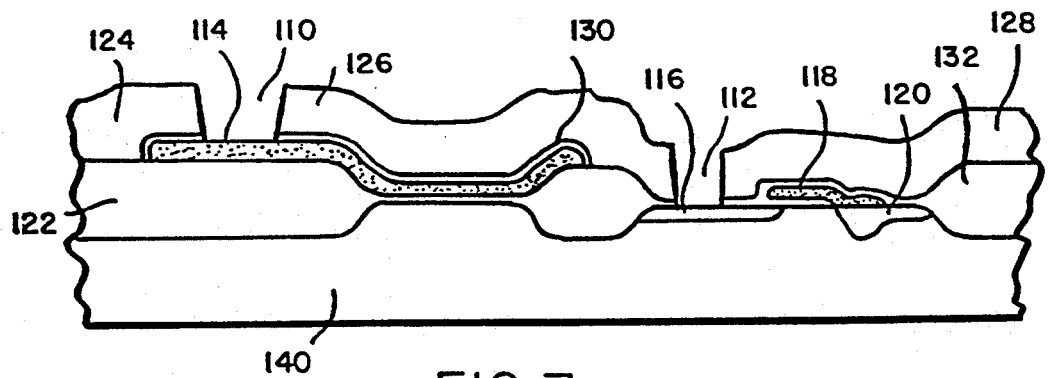
FIG. 7 depicts, in-cross section, a portion of an integrated circuit chip which has been processed by conventional NMOS techniques to the point at which recesses for metal contact vias have been formed.

The above-described process of forming conductor-insulator layers can be integrated into a conventional integrated circuit fabrication process. FIG. 7 shows an integrated circuit chip which has been processed by conventional NMOS processing techniques to the point at which recesses 110 and 112 have been formed, which will be filled with conductive material to form solid contact vias.

Silicon dioxide layers 122, 124, 126, 128, 130, and 132 and polysilicon conductors 114 and 118 have been formed. A silicon substrate 140 has been doped to form a source region 116 and a drain region 120 of an MOS transistor. The layer of polysilicon 118 connects the gate and the drain of the transistor.

At the bottom of each of the recesses 110 and 112 is silicon. Specifically, a portion of the polysilicon conductor 114 forms the bottom of recess 110 and a portion of the silicon of the substrate 140 (doped to form a source region 116) forms the bottom of recess 112. Thus the integrated circuit has been fabricated to a stage similar to that depicted in FIG. 4. At this stage tungsten can be selectively deposited on the silicon 114 and 116 which is exposed at the bottom of the recesses 110 and 112. The recesses 110 and 112 are filled with conductive material in the same manner described above in connection with FIGS. 4-6, resulting in a conductor-insulator layer free of discontinuities.

FIG. 7 also illustrates another feature of the inventive process, namely that an exposed portion of the silicon substrate, whether or not it is doped, can be used as the seed material. Thus, in recess 112, which was formed to expose region 116, the surface of region 116 can be used as the seed material for the process. This is further illustrated in FIG. 8 which depicts four conductor-insulator layers 230, 232, 234, and 236. All of the contact vias 218, 222, 224, 226, and 228 and metal interconnection lines 212, 214, 216, and 220 are formed by the above-described process. It will be appreciated that interconnection line 220 connects to circuitry out of the plane of FIG. 8. Via 226 is formed directly onto the silicon substrate using the substrate as the seed.

Figure 8:
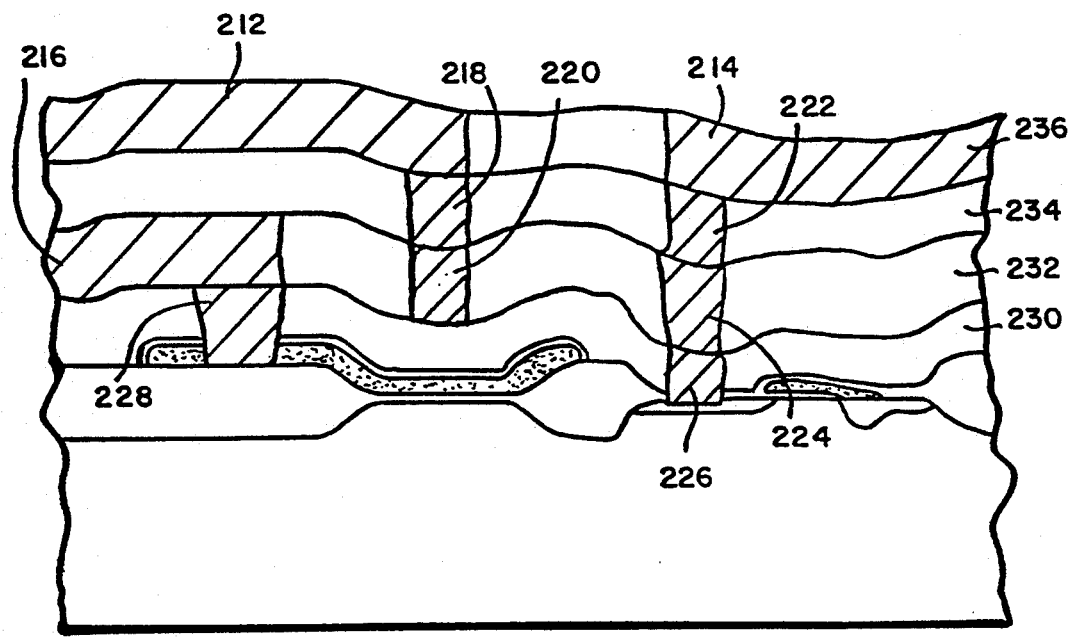
FIG. 8 depicts, in-cross section, a portion of an integrated circuit chip with an active device to which electrical connections are formed via four conductor-insulator layers.

As can be seen in FIGS. 7 and 8, the top surface of the integrated circuit chip, at the time the first conductor-insulator layer is to be formed, although uneven, is sufficiently planar to permit the formation of a conductor-insulator layer. The present invention enables the formation of multiple conductor-insulator layers above this surface without exacerbating the unevenness. The top surface of each of the four conductor-insulator layers 230, 232, 234, and 236 shown in FIG. 8 is relatively planar, that is, each conductor-insulator layer is of substantially uniform thickness; thus each succeeding conductor-insulator layer does not exacerbate the unevenness present when the first conductor-insulator layer is formed.

The instant invention can be used to advantage whether or not the process is used to form a planar layer. The instant process does not require metal sputtering or metal etching and thus does not require the expensive equipment needed for these types of chip processing. The only etching that the process requires is the etching of silicon and of silicon dioxide, both of which are well understood and easily controlled. Since with the present invention interconnection layers can be formed of material deposited by chemical vapor deposition, when used over an uneven surface, better step coverage can be obtained using the present invention than is typically obtained when depositing interconnection layers by sputtering. Further, refractory metals such as tungsten can be used to form interconnections, and can be deposited at low temperature (although the deposition need not occur at the very low temperature required when using lift-off techniques). In addition to its relatively high melting point, tungsten has better immunity from electromigration than does aluminum, the metal most commonly used for interconnections. Tungsten does not dissolve into silicon, and thus can be used with very shallow junctions without the need for a barrier layer or junction plug.

The foregoing description has been limited to a specific embodiment of this invention. Additional advantages and modifications will be apparent to those skilled in the art. The invention is, therefore, not limited to the specific details and illustrative examples shown and described in this specification. It is the object of the appended claims to cover all such variations and modifications as come within the true spirit and scope of the invention.

What is claimed as new and desired to be secured by Letters Patent of the U.S. is:

1. A method of forming a conductor-insulated layer on an integrated circuit chip comprising the steps of:
   1) forming a layer of seed material over a surface of a chip,
   2) patterning the seed material in a selected manner,
   3) forming an insulating layer over the patterned seed material,
   4) patterning the insulating layer to expose portions of the seed material,
   5) exposing the chip to a first chemical agent which acts to selectively replace said exposed seed material with a conducting material, and
   6) exposing the chip to a second chemical agent which selectively deposits further conductive material on the conductive material which has replaced the seed material.

2. A method according to claim 1 wherein said seed material is polycrystalline silicon, and said first chemical agent is tungsten fluoride whereby tungsten replaces said polycrystalline silicon.

3. A method according to claim 2 wherein said second chemical agent is tungsten hexafluoride and hydrogen whereby further tungsten is deposited on the tungsten which replaced the polycrystalline silicon.

4. A method according to claim 3 further comprising the step of: removing the integrated circuit chip form the second chemical agent when the deposited tungsten reaches the same height as the insulating layer to thereby form a relatively planar conductor-insulator layer.

5. A method according to claim 1 further comprising depositing a base insulating layer over the surface of the chip prior to the step of forming the layer of seed material.

6. A method according to claim 1 wherein the seed layer is deposited on a silicon oxide layer formed on the integrated circuit chip.

7. A method according to claim 1, wherein said first-chemical-agent-exposing step consumes substantially all said seed material.

8. A method according to claim 1, wherein said chip surface comprises a surface of an insulating layer.

9. A method according to claim 1, wherein said chip further comprises a substrate, and said surface comprises a surface of said substrate.

10. A method according to claim 1, wherein said chip further comprises a polysilicon conductor, and said chip surface comprises a surface of said conductor.

11. A method according to claim 1, wherein said first chemical agent comprises tungsten fluoride, and said second-chemical-agent-exposing step comprises the step of exposing the chip to a hydrogen gas in the presence of said first chemical agent.

12. A method according to claim 1, wherein said deposited conductive material forms a via.

13. A method according to claim 1, wherein said deposited conductive material forms an interconnection line.

14. A method according to claim 1, wherein said insulating-layer patterning step includes the step of forming at least one recess therethrough, said recess being smaller than the pattern layer of seed material.

15. A method according to claim 14, wherein said patterned layer of seed material is only used for the deposition of said conductive material.

16. A method according to claim 1, wherein said patterned layer of seed material is only used for the deposition of said conductive material.

17. A method for filling a recess in a layer of insulating material on a surface of an integrated circuit chip, wherein the top surface of the filled recess is relatively co-planar with the top surface of the insulating material, said method comprising the steps of:
   1) providing a layer of seed material on said integrated circuit chip,
   2) patterning the seed material in a selected manner,
   3) forming an insulating layer on the chip over said patterned seed material,
   4) forming vias through the insulating layer to expose the seed material,
   5) exposing the chip to a first chemical agent which replaces said exposed seed material with a conductive material,
   6) exposing the chip to a second chemical agent which operates to deposit further conductive material on the conductive material which replaces the seed material, and
   7) removing the chip from said second chemical agent when the upper surface of the conductive material is essentially co-planar with said insulating material, thereby forming a conductor-insulator layer 18. A method according to claim 17 further comprising the steps of:
   8) forming a second layer of seed material over the conductor-insulator layer formed on the surface of a chip,
   9) patterning the second layer of seed material in a selected manner,
   10) forming a second insulating layer over the patterned second layer of seed material,
   11) patterning the second insulating layer to expose portions of the exposed second layer of seed material, and
   12) exposing the chip to said first chemical agent which acts to selectively replace said seed material with the conducting material.

19. A method according to claim 18 further comprising the steps of:
   13) exposing the chip to a second chemical agent which operates to deposit further conductive material on the conductive material which replaced the exposed second layer of seed material, and
   14) removing the chip from said second chemical agent when the upper surface of the conductive material is substantially co-planar with said second insulating layer whereby an additional relatively planar conductor-insulator layer is formed.

20. A method according to claim 17 wherein said seed material is a polysilicon material and the conductive material is tungsten.

21. A method for filling a recess in a layer of insulating material on a surface of an integrated circuit chip, wherein the top surface of the filled recess is relatively co-planar with the top surface of the insulating material, said method comprising the steps of:
   1) forming a first insulating layer on the chip,
   2) patterning the first insulating layer to expose portions of the surface of the integrated circuit chip,
   3) providing a layer of seed material on said exposed portions of the integrated circuit chip and the first insulating layer,
   4) patterning the seed material in a selected manner,
   5) forming a second insulating layer on the chip over said patterned seed material
   6) forming vias through said second insulating layer to expose the seed material
   7) exposing the chip to a first chemical agent which replaces said exposed seed material with a conductive material,
   8) exposing the chip to a second chemical agent which operates to deposit further conductive material on the conductive material which replaced the seed material, and
   9) removing the chip from said second chemical agent when the upper surface of the conductive material is substantially co-planar with said insulating material whereby a relatively planar conductor-insulator layer is formed.

22. A method according to claim 21 wherein the seed material is polycrystalline silicon, the first chemical agent is tungsten fluoride, and the conductive material is tungsten.

23. A method according to claim 21 further comprising the steps of:
   10) forming a third insulating layer on the chip over the conductor-insulator layer,
   11) patterning the third insulating layer to expose portions of a surface of the conductor-insulator layer,
   12) providing a second layer of seed material on said exposed portions of the conductor-insulator layer,
   13) patterning the second layer of seed material in a selected manner,
   14) forming a fourth insulating layer on the chip over the patterned second layer of seed material
   15) forming vias through said fourth insulating layer to expose the second layer of seed material, and
   16) exposing the chip to said first chemical agent which replaces said exposed second layer of seed material with the conductive material.

24. A method for filling a recess in a layer of insulating material on a surface of an integrated circuit chip, wherein the top surface of the filled recess is relatively co-planar with the top surface of the insulating material, said method comprising the steps of:
   1) forming a first insulating layer on the chip,
   2) patterning the first insulating layer to expose portions of the surface of the integrated circuit chip,
   3) providing a first layer of seed material on said exposed portions of the integrated circuit chip and the first insulating layer,
   4) patterning the first layer of seed material in a selected manner,
   5) forming a second insulating layer on the chip over the patterned first layer of seed material,
   6) forming vias through said second insulating layer to expose the first layer of seed material,
   7) exposing the chip to a first chemical agent which replaces said exposed first layer of seed material with a conductive material,
   8) exposing the chip to a second chemical agent which operates to deposit further conductive material on the conductive material which replaced the exposed first layer of seed material until a relatively planar conductor-insulator layer is formed 9) forming a third insulating layer on the chip over the conductor-insulator layer,
10) patterning the third insulating layer to expose portions of a surface of the conductor-insulator layer,
11) providing a second layer of seed material on said exposed portions of the conductor-insulator layer,
12) patterning the second layer of seed material in a selected manner,
13) forming a fourth insulating layer on the chip over the patterned second layer of seed material,
14) forming vias through said fourth insulating layer to expose the second layer of seed material,
15) exposing the chip to said first chemical agent which replaces said exposed second layer of seed material with the conductive material,
16) exposing the chip to said second chemical agent which operates to deposit further conductive material on the conductive material which replaced the exposed second layer of seed material, and
17) removing the chip from said second chemical agent when the upper surface of the conductive material is substantially co-planar with said fourth insulating layer whereby an additional relatively planar conductor-insulator layer is formed.

* * * * *